United States Patent [19]

Takeshiro

[11] Patent Number: 5,316,980
[45] Date of Patent: May 31, 1994

[54] METHOD OF MAKING A SEMICONDUCTOR DEVICE BY DRY ETCHING PROCESS

[75] Inventor: Shinichi Takeshiro, Tokyo, Japan
[73] Assignee: NEC Corporation, Tokyo, Japan
[21] Appl. No.: 929,161
[22] Filed: Aug. 11, 1992
[30] Foreign Application Priority Data
Aug. 26, 1991 [JP] Japan ................... 3-212536
[51] Int. Cl.⁵ ........................................ H01L 21/465
[52] U.S. Cl. .............................. 437/228; 437/231; 156/643
[58] Field of Search ............. 437/225, 228, 41, 235, 437/231; 156/643, 646, 653, 644

[56] References Cited

U.S. PATENT DOCUMENTS 4,654,113  3/1987  Tuchiya et al. .............. 156/646
4,676,867  6/1987  Elkins et al. ................. 156/646

FOREIGN PATENT DOCUMENTS 0151948  8/1985  European Pat. Off. .
0243273  10/1987  European Pat. Off. .
0249173  12/1987  European Pat. Off. .
0336461  10/1989  European Pat. Off. .

OTHER PUBLICATIONS

"IEEE Transactions on Semiconductor Manufacturing", vol. 1, No. 4, Nov. 1988, New York, pp. 154-156, P. E. Riley, et al.

Primary Examiner—Robert Kunemund
Assistant Examiner—H. Jey Tsai

[57] ABSTRACT

In a method for making a semiconductor device, an insulating film, which is composed of a silicon oxide film and an organic spin-on glass film, is formed on a semiconductor substrate having a step-like part. The insulating film is thereafter etched back with a dry etching process and is thereby planarized. As an etching gas, a mixture of at least one of fluorocarbon types of gases and at least one of hydrofluorocarbon types of gases is used. An insulating film having a high planarity is thereby obtained.

1 Claim, 3 Drawing Sheets

METHOD OF MAKING A SEMICONDUCTOR DEVICE BY DRY ETCHING PROCESS

BACKGROUND OF THE INVENTION

1. Field of the Invention

This invention relates to a method for making a semiconductor device. This invention particularly relates to an etching process for use in forming a planarized insulating film from an oxide film and an organic spin-on glass film (hereinafter referred to as the "organic SOG film").

2. Description of the Related Art

Planarization of films for layer insulation is important in the formation of multi-layer wiring. In general, organic SOG films are employed to form flat insulating films.

A conventional etching process, which is employed in the formation of a planarized insulating film from an organic SOG film, is carried out in the manner described below. For the etching process of this type, an etching gas, which is constituted of a mixture of trifluoromethane ($CHF_3$) and oxygen ($O_2$), is employed. In such cases, the etching rate ratio R of a silicon oxide film to an organic SOG film is approximately 1.0.

FIGS. 4A and 4B are sectional views showing a semiconductor chip as an aid in explaining a conventional etching process.

As illustrated in FIG. 4A, an aluminum wiring 7 having a thickness of 800 nm is formed on a BPSG film 6, which has been overlaid on a silicon substrate 4B. Thereafter, a silicon oxide film 8 is formed to a thickness of 800 nm by the plasma CVD process, and an organic SOG film 9 having a thickness of 300 nm is applied by coating. At this time, part of the organic SOG film 9 corresponding to the position of the aluminum wiring 7 becomes thin, and part of the organic SOG film 9 corresponding to the position free of the aluminum wiring 7 becomes thick. Thereafter, the semiconductor substrate 4B, which has thus been provided with the films, is subjected to an etching process utilizing $CHF_3$ and $O_2$. In such cases, from the point of time at which the silicon oxide film 8 becomes exposed, oxygen in the silicon oxide film 8 is fed therefrom into the plasma. Therefore, the etching rate of the organic SOG film 9 increases, and the etching rate ratio of the silicon oxide film 8 to the organic SOG film 9 becomes approximately 0.5.

Therefore, as illustrated in FIG. 4B, in cases where the etching process is carried out until the thickness of part of the silicon oxide film 8 located on the aluminum wiring 7 becomes 200 nm, the organic SOG film 9 is completely removed by etching. Thus a flat shape of the insulating film cannot be obtained.

As described above, with the conventional process for planarizing an insulating film constituted of an organic SOG film, a silicon oxide film located under the organic SOG film becomes exposed during the etching, and oxygen in the silicon oxide film is thereby fed into the plasma. As a result, the etching rate of the organic SOG film becomes higher than that of the silicon oxide film. Therefore, it is difficult to form a flat insulating film having a predetermined thickness. For this reason, the step coverage of an upper wiring becomes bad, and wire breakage occurs. Accordingly, the reliability and yield of semiconductor devices cannot be kept high.

SUMMARY OF THE INVENTION

The primary object of the present invention is to provide a method for making a semiconductor device, which affords a flat insulating film and enables the reliability and the yield of semiconductor devices to be kept high.

The present invention provides a first method for making a semiconductor device wherein an insulating film, which is composed of a silicon oxide film and an organic spin-on glass film, is formed on a semiconductor substrate having a step-like part, is thereafter etched back with a dry etching process, and is thereby planarized, wherein the improvement comprises using, as an etching gas, a mixture of at least one of fluorocarbon types of gases and at least one of hydrofluorocarbon types of gases.

The present invention also provides a second method for making a semiconductor device wherein an insulating film, which is composed of a silicon oxide film and an organic spin-on glass film, is formed on a semiconductor substrate having a step-like part, is thereafter etched back with a dry etching process, and is thereby planarized, wherein the improvement comprises, during said dry etching process, keeping the temperature of a lower electrode, on which said semiconductor substrate is supported, at a value 40° C. to 60° C. lower than the temperatures of an upper electrode, which stands facing said lower electrode, and of an etching chamber, and using a fluorocarbon type of gas as a reaction gas.

With the first and second methods for making a semiconductor device in accordance with the present invention, a mixture of at least one of fluorocarbon types of gases and at least one of hydrofluorocarbon types of gases is utilized as the etching gas, or a fluorocarbon type of gas is used as a reaction gas. Also, the etching rate ratio of the silicon oxide film to the organic SOG film is set to a value between 1.5 and 2.0. Therefore, a flat insulating film can be obtained, and the reliability and the yield of semiconductor devices can be kept high.

DESCRIPTION OF THE PREFERRED EMBODIMENT

The present invention will hereinbelow be described in further detail with reference to the accompanying drawings.

Figure 1A:
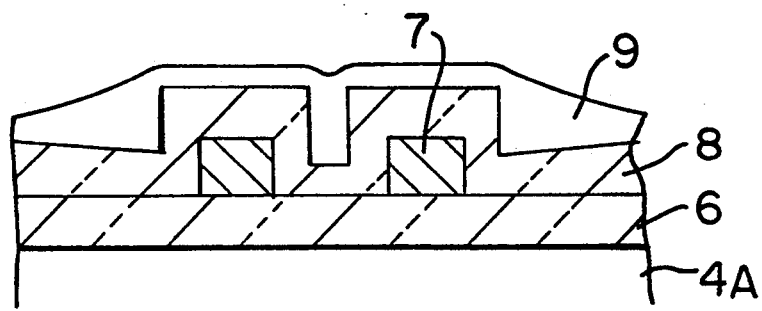
FIGS. 1A and 1B are sectional views showing a semiconductor chip as an aid in explaining a first embodiment of the present invention.
Figure 1B:
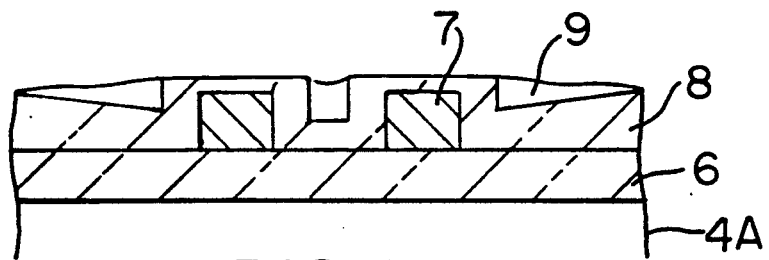

FIGS. 1A and 1B are sectional views showing a semiconductor chip as an aid in explaining a first embodiment of the method for making a semiconductor device in accordance with the present invention.

Figure 2:
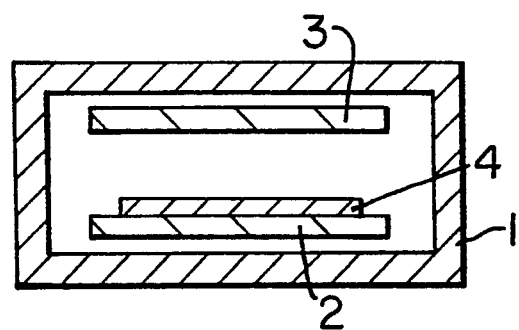
FIG. 2 is a schematic view showing a reactive ion etching apparatus employed in the embodiment of the present invention.

FIG. 2 is a schematic view showing a parallel-plate type of reactive ion etching apparatus employed in the embodiment of the present invention. A lower electrode 2 is located in an etching chamber 1. An upper electrode 3 is located facing the lower electrode 2. A silicon substrate 4 is placed on the lower electrode 2. A 13.56 MHz high-frequency electric power is applied to the lower electrode 2, and an etching process is carried out.

Table 1 below shows the etching characteristics of an etching gas as an aid in explaining the first embodiment of the present invention. In the first embodiment, hexafluoroethane ($C_2F_6$), trifluoromethane ($CHF_3$), and helium (He) gases are used during the etching process.

By way of example, the temperatures of the lower electrode 2 and the upper electrode 3 are set at 10° C., and the flow rate of He is set at 90 sccm (standard cubic centimeters per minute). The pressure during the etching process is set at 260 Pa, and the high-frequency electric power density is set at 2.0 W/cm². Also, the total flow rate of $C_2F_6$ and $CHF_3$ is set at 20 sccm, and the flow rate of $C_2F_6$ is changed from 5 sccm to 20 sccm. In such cases, the etching rate of the silicon oxide film falls within the range of 330 nm/min to 460 nm/min, and the etching rate of the organic SOG film falls within the range of 110 nm/min to 410 nm/min. Also, etching rate ratio of the silicon oxide film to the organic SOG film falls within the range between 3.0 and 1.1.

First, as illustrated in FIG. 1A, an aluminum wiring 7 having a thickness of 800 nm is formed on a BPSG film 6, which has been overlaid on a silicon substrate 4A. Thereafter, a silicon oxide film 8 is formed to a thickness of 800 nm by the plasma CVD process, and an organic SOG film 9 having a thickness of 300 nm is applied by coating. At this time, part of the organic SOG film 9 corresponding to the position of the aluminum wiring 7 becomes thin, and part of the organic SOG film 9 corresponding to the position free of the aluminum wiring 7 becomes thick. The semiconductor substrate 4A, which has thus been provided with the films, is placed on the lower electrode 2 in the etching chamber 1. In the etching chamber, the semiconductor substrate 4A is subjected to an etching process, during which the flow rate of $C_2F_6$ and the flow rate of $CHF_3$ are adjusted as being equal to 10 sccm. In such cases, the etching rate ratio of the silicon oxide film 8 to the organic SOG film 9 is 1.5. From the point of time at which the silicon oxide film 8 becomes exposed, oxygen in the silicon oxide film 8 is fed therefrom into the plasma. Therefore, the etching rate of the organic SOG film 9 increases. Accordingly, the etching rate ratio of the silicon oxide film 8 to the organic SOG film 9 becomes approximately 1.0.

As described above, the etching rates of the silicon oxide film 8 and the organic SOG film 9 are approximately equal to each other. Therefore, as illustrated in FIG. 1B, in cases where the etching process is carried out until the thickness of part of the silicon oxide film 8 located on the aluminum wiring 7 becomes 200 nm, the organic SOG film 9 is not completely removed by etching. Thus a flat shape of the insulating film can be obtained.

TABLE 1

| $C_2F_6:CHF_3$ flow rate (sccm) | Etching rate of silicon oxide film (A) (nm/min) | Etching rate of organic SOG film (B) (nm/min) | Etching rate ratio (A/B) |
|---|---|---|---|
| 5:15 | 330 | 110 | 3.0 |
| 10:10 | 390 | 260 | 1.5 |
| 15:5 | 420 | 350 | 1.2 |
| 20:0 | 460 | 410 | 1.1 |

The range of the etching rate ratio of the silicon oxide film to the organic SOG film in the embodiment of the present invention will be described hereinbelow. In the embodiment described above, the etching rate ratio of the silicon oxide film to the organic SOG film is 1.5. Nearly the same flat insulating films can be obtained also when the etching rate ratio of the silicon oxide film to the organic SOG film ranges up to 2.0.

Figure 3:
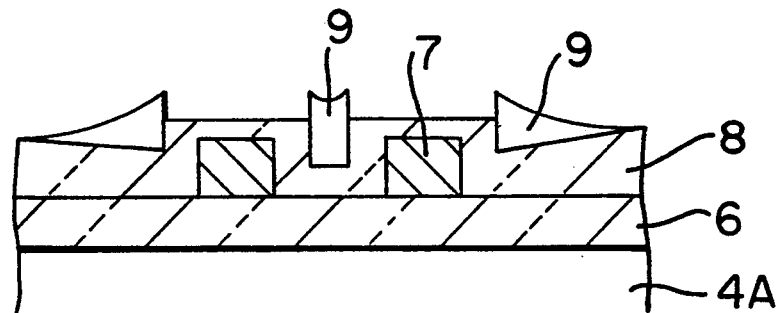
FIG. 3 is a sectional view showing a semiconductor chip as an aid in explaining etching conditions.
Figure 4A:
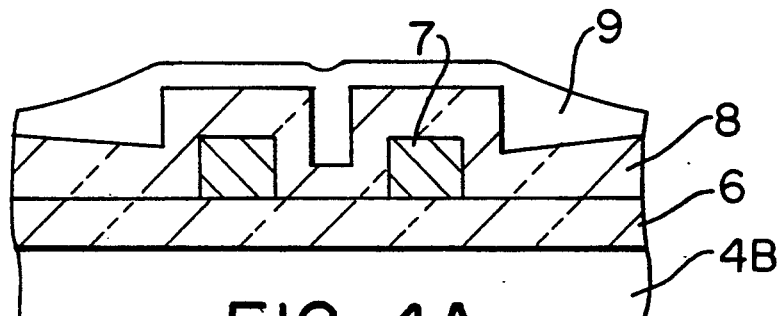
FIGS. 4A and 4B are sectional views showing a semiconductor chip as an aid in explaining a conventional etching process.
Figure 4B:
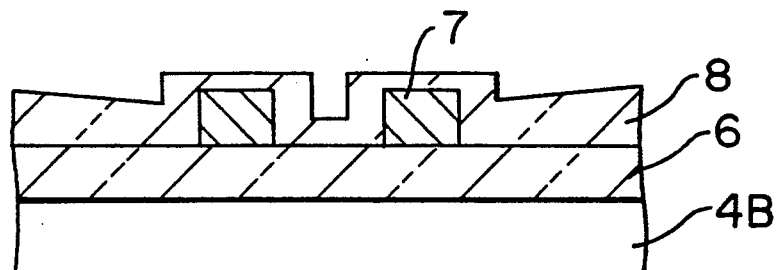

However, in cases where the etching rate ratio of the silicon oxide film to the organic SOG film exceeds 2.0, even if oxygen is fed out of the silicon oxide film 8, the etching rate of the silicon oxide film 8 remains excessively high. Therefore, as illustrated in FIG. 3, when the etching process is carried out until the thickness of part of the silicon oxide film 8 located on the aluminum wiring 7 becomes 200 nm, the organic SOG film 9 remains in convex forms, and a flat shape of the insulating film cannot be obtained. In such cases, when an upper layer wiring constituted of Al, or the like, is formed on such an insulating film, wire breakage often occurs. Conversely, in cases where the etching rate ratio of the silicon oxide film to the organic SOG film is below 1.5, the etching rate of the organic SOG film becomes higher than the etching rate of the silicon oxide film after the silicon oxide film becomes exposed, and therefore the problem occurs in that the organic SOG film is completely removed as with the conventional technique.

A second embodiment of the present invention will be described hereinbelow. Table 2 below shows the etching characteristics of an etching gas as an aid in explaining the second embodiment of the present invention. In the second embodiment, when the temperature of the lower electrode 2 is 10° C., the temperatures of the upper electrode 3 and the etching chamber 1 are set at 50° C. By way of example, the flow rate of He is set at 90 sccm, and the pressure during the etching process is set at 260 Pa. The high-frequency electric power density is set at 2.0 W/cm². Also, the total flow rate of $C_2F_6$ and $CHF_3$ is set at 20 sccm, and the flow rate of $C_2F_6$ is changed from 10 sccm to 20 sccm. In such cases, the etching rate of the silicon oxide film falls within the range of 230 nm/min to 400 nm/min, and the etching rate of the organic SOG film falls within the range of 95 nm/min to 270 nm/min. Also, etching rate ratio of the silicon oxide film to the organic SOG film falls within the range between 2.4 and 1.5. In the second embodiment, also when the flow rate is set at 20 sccm with $C_2F_6$ alone, the etching rate ratio of the silicon oxide film to the organic SOG film becomes equal to 1.5. Also, as in the first embodiment, when the silicon oxide film 8 becomes exposed, the etching rate ratio of the silicon oxide film 8 to the organic SOG film 9 becomes approximately 1:1.

In the second embodiment, the semiconductor substrate 4A, which is shown in FIG. 1 and which is of the same type as that used in the first embodiment, is processed by setting the flow rate at 20 sccm only with $C_2F_6$. Also, in cases where the etching process is carried out until the thickness of part of the silicon oxide film 8 located on the aluminum wiring 7 becomes 200 nm, the organic SOG film 9 is not completely removed by etching. Thus, as with the first embodiment, a flat shape of the insulating film can be obtained. In the second embodiment, the temperature of the upper electrode 3 and the etching chamber 1 are set at 50° C. Therefore, reaction products occurring during the etching process do not stick to inner walls of the etching chamber 1 and the upper electrode 3. Accordingly, the second embodiment has the advantages in that the etching rate does not decrease and no increase in particles occurs even if a plurality of semiconductor substrates are etched.

TABLE 2

| $C_2F_6$:$CHF_3$ flow rate (sccm) | Etching rate of silicon oxide film (A) (nm/min) | Etching rate of organic SOG film (B) (nm/min) | Etching rate ratio (A/B) |
| --- | --- | --- | --- |
| 10:10 | 230 | 95 | 2.4 |
| 15:5 | 350 | 190 | 1.8 |
| 20:0 | 400 | 270 | 1.5 |

The range of the difference between the temperature of the lower electrode 2 and the temperatures of the upper electrode 3 and the etching chamber 1 in the second embodiment will be described hereinbelow.

Figure 5:
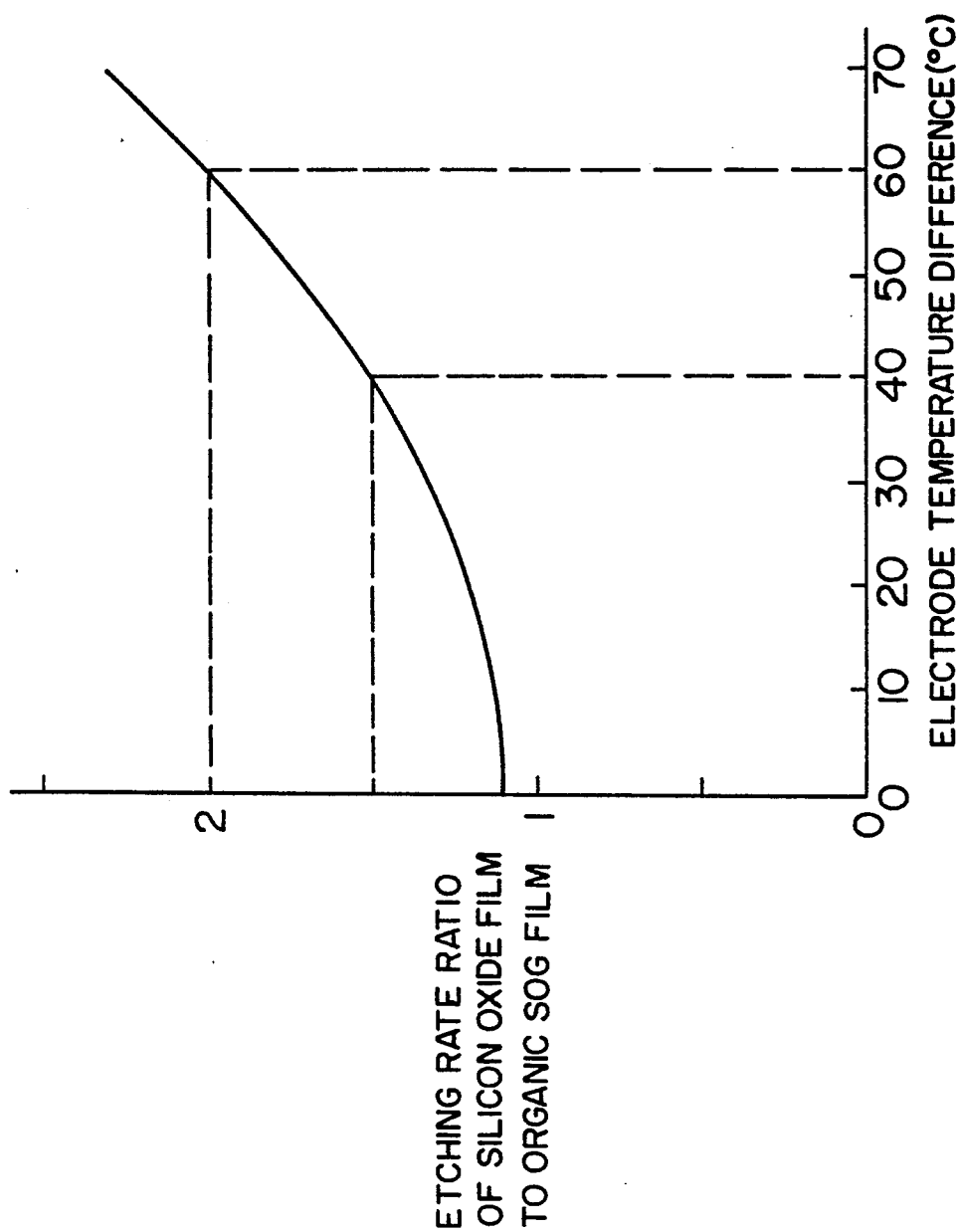
FIG. 5 is a graph showing the relationship between the difference in electrode temperature and the etching rate ratio.

FIG. 5 is a graph showing the relationship between the difference in electrode temperature and the etching rate ratio of the silicon oxide film to the organic SOG film. In cases where the temperature of the lower electrode falls within the range of 0° C. to 60° C., in order that the etching rate ratio of the silicon oxide film to the organic SOG film is to fall within the range between 1.5 and 2.0, the difference in temperature between the electrodes should fall within the range of 40° C. to 60° C. The etching process should preferably be carried out with the difference in electrode temperature falling within such a range.

In the aforesaid embodiments of the present invention, $C_2F_6$ is employed as the fluorocarbon type of gas. The same effects can also be obtained when one or more of other fluorocarbon types of gases, such as $CF_4$ and $C_3F_8$, are used. Also, in the aforesaid embodiments, $CHF_3$ is employed as the hydrofluorocarbon type of gas. The same effects can also be obtained when a different fluorocarbon type of gas, such as $CH_2F_2$, is used. Additionally, in the aforesaid embodiments, He is used as the rare gas. The same effects can be obtained also when Ne or Ar is used or when no rare gas is used.

What is claimed is:

1. A method for making a semiconductor device wherein an insulating film, which is composed of a silicon oxide film and an organic spin-on glass film, is formed on a semiconductor substrate having a step part, is thereafter etched back with a dry etching process, and is thereby planarized, wherein, during said dry etching process, the temperature of a lower electrode, on which said semiconductor substrate is supported, is maintained at a value 40° C. to 60° C. lower than the temperatures of an upper electrode, which stands facing said lower electrode, and of an etching chamber, wherein hexafluoroethane gas is used as a reaction gas, and wherein said etching process is carried out under the conditions of reaction gas flow rates and electrode temperatures such that the etching rate of said silicon oxide film is 1.5 to 2.0 times higher than the etching rate of said organic spin-on glass film.

* * * * *